United States Patent
Ide et al.

(10) Patent No.: US 7,422,449 B2
(45) Date of Patent: Sep. 9, 2008

(54) WIRING BOARD WITH LEAD PINS, AND LEAD PIN

(75) Inventors: Kazuhiko Ide, Nagano (JP); Hiroyuki Motoda, Nagano (JP); Yoshinori Furihata, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/351,028

(22) Filed: Feb. 9, 2006

(65) Prior Publication Data

US 2008/0009155 A1    Jan. 10, 2008

(30) Foreign Application Priority Data

Jun. 7, 2005    (JP) ............................. 2005-166455

(51) Int. Cl.
*H01R 12/00* (2006.01)

(52) U.S. Cl. ........................................................ 439/83

(58) Field of Classification Search .................. 439/83, 439/874–876, 84; 174/263, 265, 94 R; 361/773–774, 361/403

See application file for complete search history.

(56) References Cited

U.S. PATENT DOCUMENTS 5,593,322 A * 1/1997 Swamy et al. ............... 439/660
6,799,976 B1 * 10/2004 Mok et al. ..................... 439/55
6,976,855 B2 * 12/2005 Kennedy et al. .............. 439/83

FOREIGN PATENT DOCUMENTS

| JP | 54-122768 | 2/1953 |
|----|-----------|--------|
| JP | 63-204752 | 8/1988 |
| JP | 2001-217342 | 8/2001 |
| JP | 2001-291815 | 10/2001 |
| JP | 2005-032905 | 2/2005 |

* cited by examiner

*Primary Examiner*—Jean F Duverne
(74) *Attorney, Agent, or Firm*—Rankin, Hill & Clark LLP (57) ABSTRACT

A wiring board with lead pins having high reliability is provided. When the lead pins are attached to electrode pads, the lead pins are attached to the electrode pads without leaving voids in a conductive agent, and bonding strength of the lead pins are improved. When the wiring board to which the lead pins are attached is reheated, the lead pins are prevented from being inclined or shifted from their normal positions. In the wiring board with lead pins formed by attaching head portions of the lead pins to the electrode pads formed on the wiring board through the conductive agent, the lead pin has notch portions are formed in cut-out shapes in peripheral edge portion of the disk shaped head portion.

13 Claims, 5 Drawing Sheets

WIRING BOARD WITH LEAD PINS, AND LEAD PIN

This application claims foreign priority based on Japanese Patent application No. 2005-166455, filed Jun. 7, 2005, the contents of which is incorporated herein by reference in its entirety.

BACKGROUND OF THE INVENTION

1. Field of the Invention

The present invention relates to a wiring board with lead pins and a lead pin, and more particularly to a wiring board with lead pins and a lead pin used for the wiring board, the wiring board being formed by attaching the lead pins to electrode pads formed on a surface of the board such as a pin grid array (PGA) type wiring board.

2. Description of the Related Art

Figure 6A:
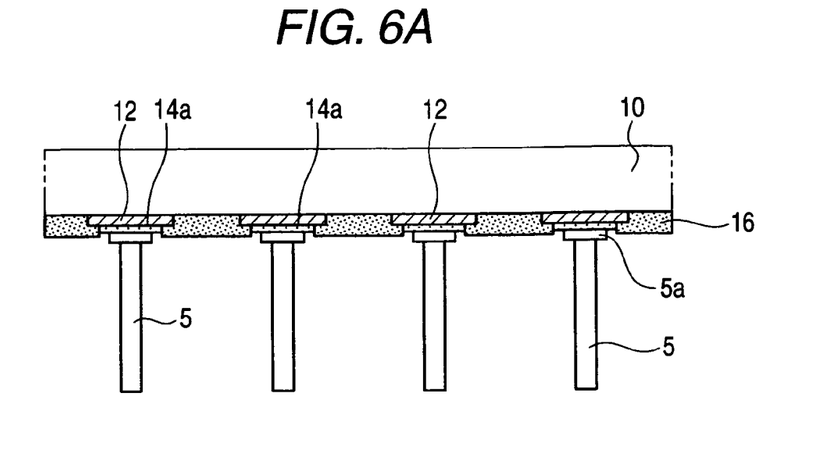
FIGS. 6A to 6C are sectional views showing a structure of a related wiring board with lead pins.
Figure 6B:
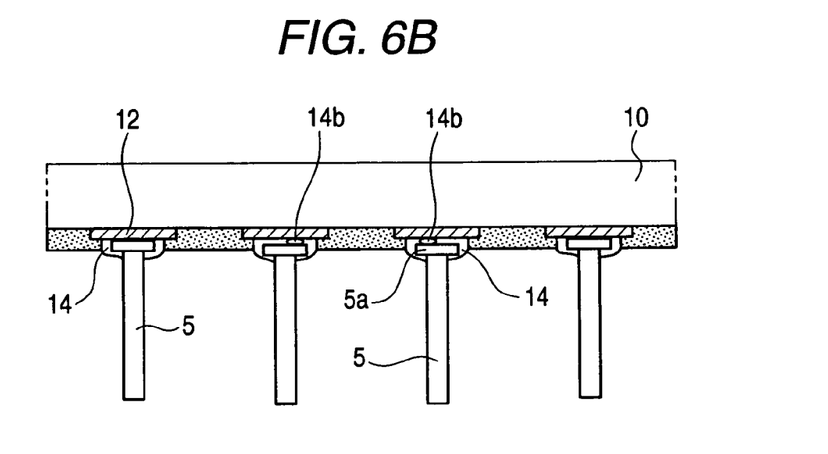
Figure 6C:
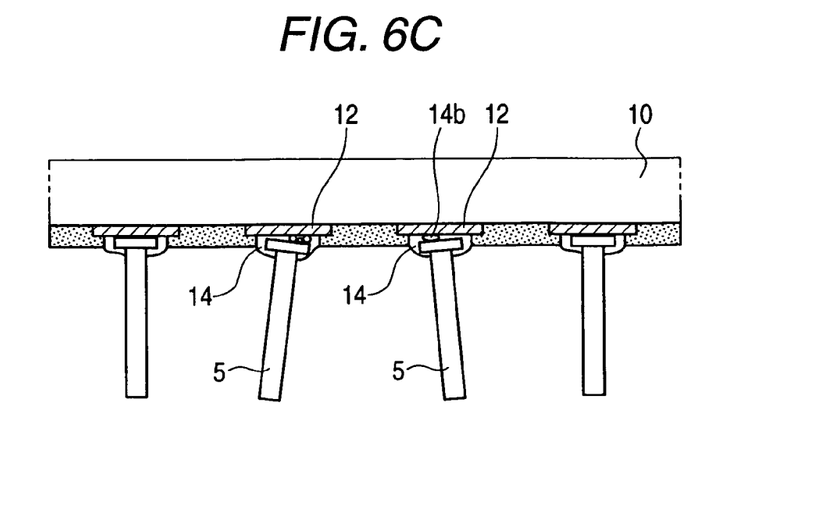

FIGS. 6A to 6C show a related manufacturing process for manufacturing a wiring board with lead pins by attaching lead pins 5 to electrode pads 12 formed on a surface of a wiring board 10. FIG. 6A shows a state in which solder paste 14a is applied to surfaces of the electrode pads 12 formed on the wiring board 10, and the lead pins 5 are arranged so as to be aligned with the electrode pads 12 respectively. A surface of the wiring board 10 on which the electrode pads 12 are formed is coated with a solder resist 16, and the solder resist 16 has circular shaped opening portions in parts corresponding to the electrode pads 12 to which the lead pins 5 are attached. Protective plating such as gold plating is applied to the opening portions on the electrode pads 12.

FIG. 6B shows a state in which the lead pins 5 are attached to the electrode pads 12 by melting the solder paste 14a with reflow heating. The lead pins 5 are pins (flat head pins) that are generally used, whose head portions 5a are formed in disk shapes.

The solder paste 14a melts and goes up to the head portions 5a of the lead pins 5 in a meniscus shape by the reflow heating so that the lead pins 5 are attached to the electrode pads 12. However, during the reflow heating, flux composition or the like included in the solder paste 14a is volatilized, and the volatilized gas may not be released from the solder paste 14a. Thus, the volatilized gas may remain as voids 14b in the attached portions of the lead pins 5 and the electrode pads 12.

After the lead pins 5 are attached to the wiring board 10, when the wiring board 10 (package) is reheated so as to mount semiconductor elements or circuit components on the wiring board 10, gas or air remaining as the voids 14b in a solder 14 expands in the solder 14, or is liable to incline the lead pins 5 or shift the lead pins 5 from their normal positions so as to escape from the melted solder 14. FIG. 6C explanatorily shows a state in which the lead pins 5 are inclined due to the influence of the voids 14b when the wiring board 10 is reheated approximately to a temperature at which the solder 14 melts. Problems are described in JP-A-2001-291815, such that the lead pins 5 are inclined or shifted from the normal positions due to the voids 14b in the solder 14 when the wiring board 10 is reheated after the lead pins 5 are attached to the wiring board 10.

As a method for suppressing the influence of the voids 14b remaining in the solder 14 when the lead pins 5 are attached to the electrode pads 12 by using the solder, an application amount of the solder paste to be applied on the electrode pads 12 is simply reduced. However, when the application amount of the solder paste is reduced, a problem arises that a bonding strength of the lead pins 5 and the electrode pads 12 is deteriorated. Further, in JP-A-2001-291815, as the method for suppressing the influence of the voids 14b, a configuration is described in which grooves are formed on an upper surface of the head portion of the lead pin so that the gas due to the flux composition included in the solder paste or the air included in the solder paste escapes externally along the grooves.

However, in the case where the head portions of the lead pins are formed in flat planes, although the grooves are provided in the head portions, an operation for releasing the volatilized gas due to the flux composition or releasing the air from the solder when reheating the wiring board is not necessarily effective. Further, since a semiconductor element is becoming to have multiple pins, the lead pin is to have an extremely small diameter, for instance, an outside diameter of the head portion of the lead pin is 1 mm or smaller. Accordingly, when the head portions or the like are worked finely on in order to manufacture the lead pins having the extremely small diameter as described above, mass production of the lead pins is difficult to be achieved.

In JP-A-2001-217342, a recessed part is formed on a side surface, which is perpendicular to an end face of a head portion facing a pin attaching portion provided on a board, of the head portion of the lead pin so as to raise the joint strength of the lead pin.

SUMMARY OF THE INVENTION

An object of the present invention is to provide a wiring board with lead pins in which occurrence of product deficiency can be suppressed with high reliability, and to provide a lead pin that can be preferably used in manufacturing the wiring board with lead pins. When the lead pins are attached to electrode pads by using a solder paste or an ordinary electrically conductive adhesive, the lead pins can be attached to the electrode pads without leaving voids in the solder paste or the electrically conductive adhesive. Thus, bonding strength of the lead pins can be improved, and when the wiring board to which the lead pins are attached is reheated, the lead pins can be prevented from being inclined or shifted from their normal positions.

In some implementations, a wiring board of the invention comprises: at least one electrode pad formed on the wiring board; and at least one lead pin of which head portion is attached to the electrode pad with a conductive agent, wherein the head portion of the lead pin has an end face which is formed in a conically protruded shape, the end face facing the electrode pad, and the head portion of the lead pin has at least one notch portion formed in a peripheral edge portion of the head portion, the notch portion being cut out in a direction of thickness of the head portion.

As the conductive agent, an electrically conductive adhesive such as solder or resin may be used. Further, a single or a plurality of the notch portions may be formed in the head portion, and may be provided at suitable positions in the peripheral edge portion of the head portion. Further, when the head portion of the lead pin is attached to the electrode pad through the conductive agent such as solder paste, gas obtained as a result of volatilized flux composition or the like included in the conductive agent or air mixed in the conductive agent is easily released externally. Further, an amount of the conductive agent which is filled between the head portion of the lead pin and the electrode pad can be ensured so as to improve the bonding strength of the lead pin and the electrode pad.

In the wiring board of the invention, the at least one notch portion comprises four notch portions being provided at equal intervals in a circumferential direction of the head portion. Accordingly, a positional displacement of the lead pin can be suppressed when the wiring board is reheated, and an appropriate bonding strength to the electrode pad can be easily obtained.

In the wiring board of the invention, the lead pin includes a shaft portion which is integrally formed with the head portion through a C chamfered portion, the C chamfered portion is formed in a part of the shaft portion, and a surface of the C chamfered portion is tapered shaped so that the C chamfered portion is enlarged in diameter on the head portion side. Thus, the conductive agent filled in the notch portions of the head portion goes up to and adheres to the C chamfered portion. Accordingly, the bonding strength of the lead pin and the electrode pad can be increased.

In the wiring board of the invention, the conductive agent is solder. Thus, the lead pin can be assuredly attached to the electrode pad, and semiconductor elements or the like can be easily mounted on the wiring board by reheating the wiring board with lead pins.

In the wiring board of the invention, a distance between an edge portion of the notch portion and an edge portion of the C chamfered portion is smaller than a distance between an outer circumferential surface of the head portion and the edge portion of the C chamfered portion.

In some implementations, a lead pin of the invention used for a wiring board comprises: a head portion of which end face facing an electrode pad of the wiring board is formed in a conically protruded shape; and a shaft portion which is integrally formed with the head portion, wherein the head portion has at least one notch portion formed in a peripheral edge portion of the head portion, the notch portion being cut out in a direction of thickness of the head portion.

In the lead pin of the invention, the at least one notch portion comprises four notch portions being provided at equal intervals in a circumferential direction of the head portion.

In the lead pin of the invention, a connection portion of the shaft portion and the head portion is formed as a chamfered portion of which surface is tapered shaped so that the C chamfered portion is enlarged in diameter on the head portion side, and the C chamfered portion is formed in a part of the shaft portion.

In the lead pin of the invention, a distance between an edge portion of the notch portion and an edge portion of the C chamfered portion is smaller than a distance between an outer circumferential surface of the head portion and the edge portion of the C chamfered portion.

In the wiring board with lead pins according to the present invention, the lead pins are assuredly attached to the electrode pads formed on the wiring board. When the lead pins are attached to the electrode pads by using the conductive agent, voids can be prevented from remaining in attached portions of the lead pins and the electrode pads. Thus, the bonding strength of the lead pins and the electrode pads can be ensured, and the lead pins can be prevented from being inclined or shifted from their normal positions when the wiring board is reheated. Accordingly, the wiring board with lead pins having high reliability can be provided.

DESCRIPTION OF THE PREFERRED EMBODIMENTS

Figure 1:
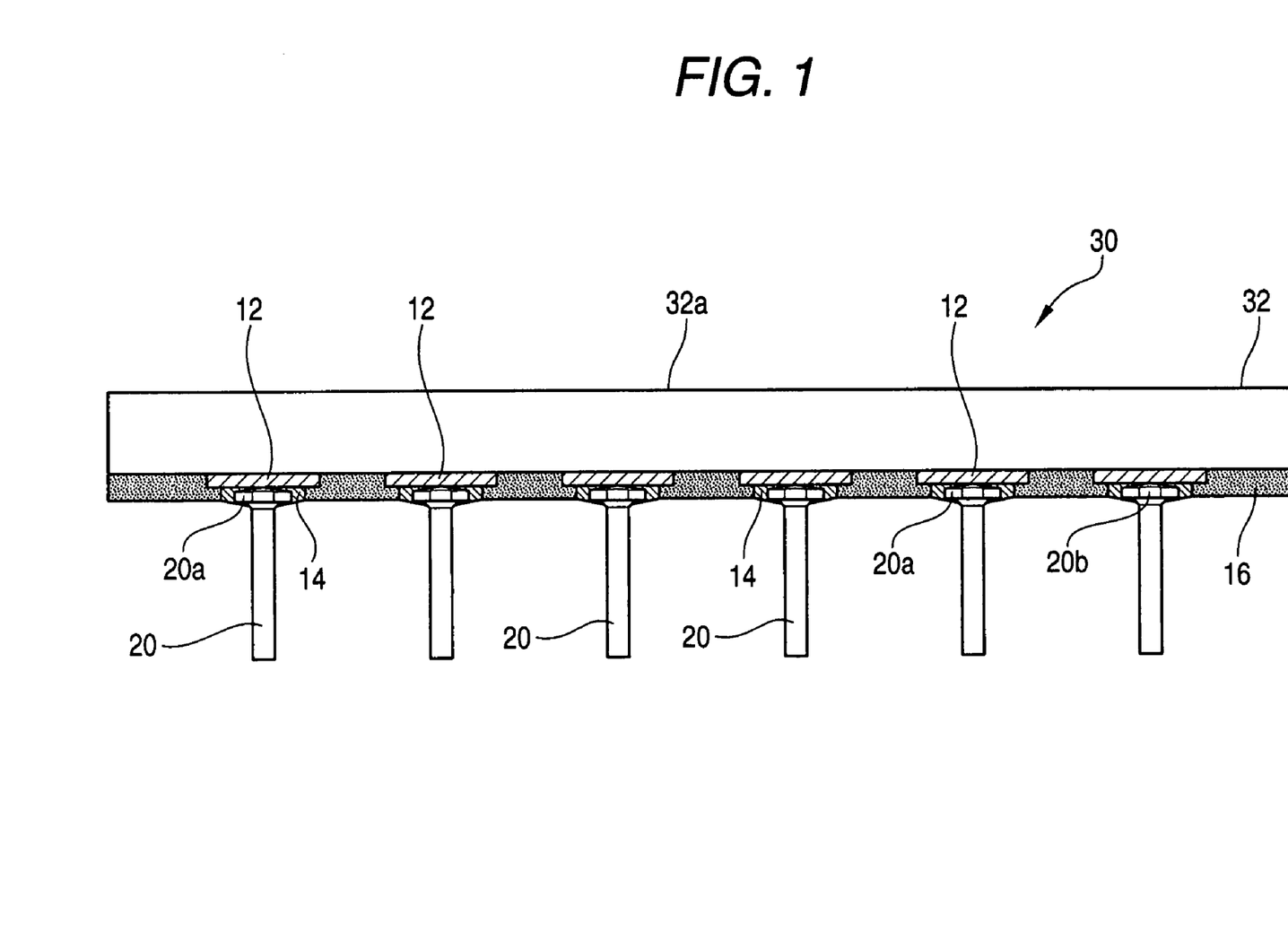
FIG. 1 is a partial sectional view showing a structure of a wiring board with lead pins.

FIG. 1 is a partial sectional view showing a structure of a wiring board with lead pins according to an embodiment of the present invention. In a wiring board 30 with lead pins according to this embodiment, one surface of a wiring board 32 is formed as a mounting portion 32a for mounting a semiconductor element or the like. On the other surface of the wiring board 32, electrode pads 12 are provided and lead pins 20 are attached to the electrode pads 12. On the mounting portion 32a, a wiring pattern for mounting the semiconductor element or circuit components such as resistance is formed. A structure of the wiring pattern formed on the mounting portion 32a is the same as that of an ordinary wiring board. In FIG. 1, the structure of the mounting portion 32a is omitted.

The other surface of the wiring board 32 is coated with a solder resist 16 as a protective coating except surfaces of the electrode pads 12 to which the lead pins 20 are attached. The electrode pads 12 are formed with copper layers. A nickel plating and a gold plating as a protective plating are applied to exposed portions that are not coated with the solder resist 16 so as to improve bonding property of the electrode pads 12 to the lead pins 20.

When the lead pins 20 are attached to the electrode pads 12, solder paste is applied to the exposed surfaces of the electrode pads 12, and the lead pins 20 are respectively arranged so as to be aligned with the electrode pads 12. Then, the wiring board is reflow heated so as to attach the lead pins 20 to the electrode pads 12 by solder 14. In this embodiment, after the solder paste is applied to the electrode pads 12, the lead pins 20 are supported by supporting jigs in order to arrange the lead pins 20 so as to be aligned with the electrode pads 12, and the lead pins 20 are supported perpendicular to the board surface of the wiring board 32.

In such a way, as shown in FIG. 1, the wiring board 30 with lead pins is obtained in which the lead pins 20 are respectively attached, perpendicular to the board surface, to the electrode pads 12 formed on the other surface of the wiring board 32.

Figure 2A:
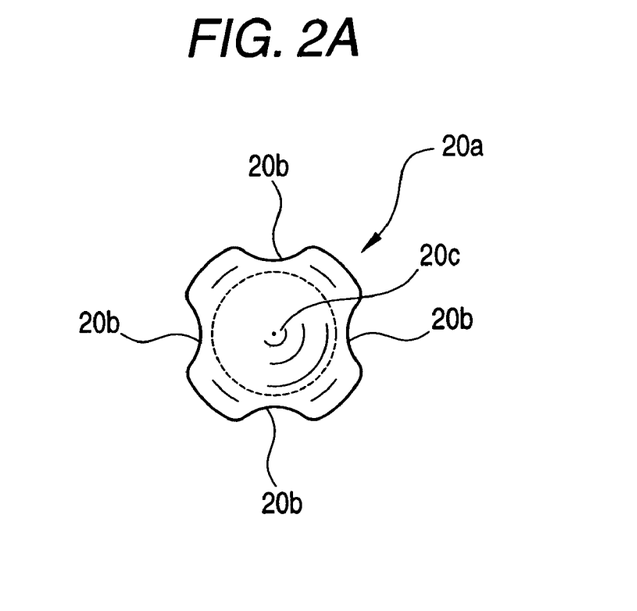
FIG. 2A is a plan view of a lead pin.
Figure 2B:
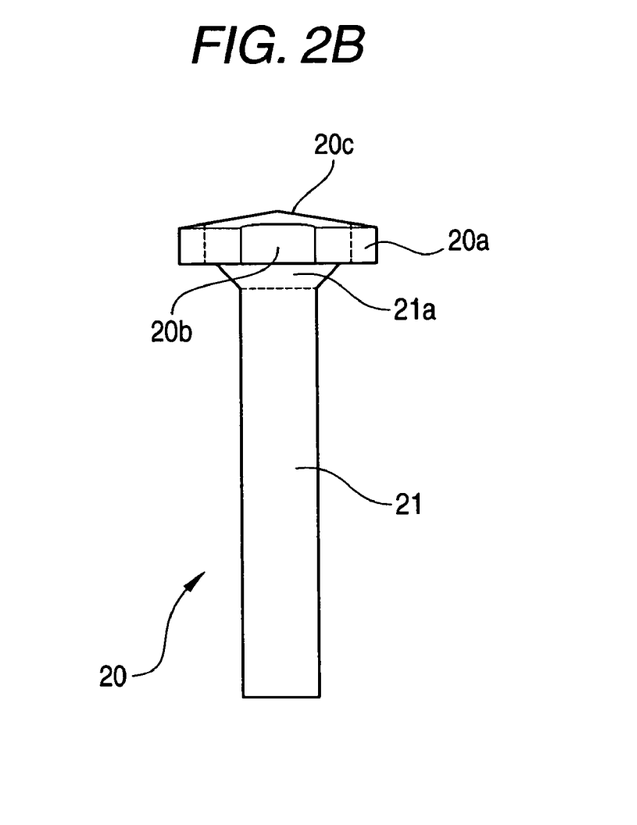
FIG. 2B is a front view of the lead pin.

FIGS. 2A and 2B show enlarged forms of a structure of the lead pin 20 used for the wiring board 30 with lead pins. FIG. 2A is a plan view of the lead pin 20, and FIG. 2B is a front view there of.

As shown in FIG. 2B, the lead pin 20 includes a shaft portion 21 which is needle-shaped, and a head portion 20a formed integrally with the shaft portion 21 at one end of the shaft portion 21. In the vicinity of a connecting portion of the shaft portion 21 and the head portion 20a, a C chamfered portion 21a is formed of which surface is tapered shaped so that the C chamfered portion 21a is enlarged in diameter on a side of the head portion 20. The C chamfered portion 21a forms a part of the shaft portion 21.

In the lead pin 20 of this embodiment, a feature of the structure resides in a shape of the head portion 20a. Specifically, the head portion 20a has four notch portions 20b formed at equal intervals in a direction of circumference in a peripheral edge portion of a disk shaped flange body. An entire end face of the flange body, which is on a side of a surface facing the electrode pad 12, is formed as a conical protrusion 20c.

The notch portions 20b are formed in cut-out shapes which are cut in a direction of thickness of the flange body. The four notch portions 20b are formed at the four positions in the outer peripheral edge of the disk shaped flange body. Thus, when the head portion 20a is looked from a side of the surface to be attached to the electrode pad 12, corner parts protrude at both sides of the notch portions 20b, so that a plan view of the head portion 20a is, on the whole, similarly square shaped (FIG. 2A).

As for a dimension of the lead pin 20 used for the wiring board with lead pins of this embodiment, entire length of the lead pin 20 is 2 mm, an outside diameter of the shaft portion 21 is 0.3 mm, an outside diameter of the head portion 20a is 0.7 mm, a height of the conical protrusion 20c is 0.08 mm and a height of the C chamfered portion 21a is 0.05 mm.

The lead pin 20 is manufactured by performing a squeezing process on a wire rod of a certain diameter using a metal mold. The notch portions 20b are formed on the peripheral edge portion of the head portion 20a and the conical protrusion 20c can be formed on the end face of the head portion 20a by performing the process operation of the metal mold once. The lead pin can be manufactured by the process similar to that of a flat pin. Since the lead pin 20 used in this embodiment has an extremely small diameter and also the head portion 20a is small, the notch portion 20b, etc., of the lead pin 20, which is actually manufactured, has a shape slightly different from the design value.

The wire rod used in this embodiment is a copper wire, and a nickel plating and a gold plating are applied to the molded wire so as to obtain the lead pin 20.

Figure 3A:
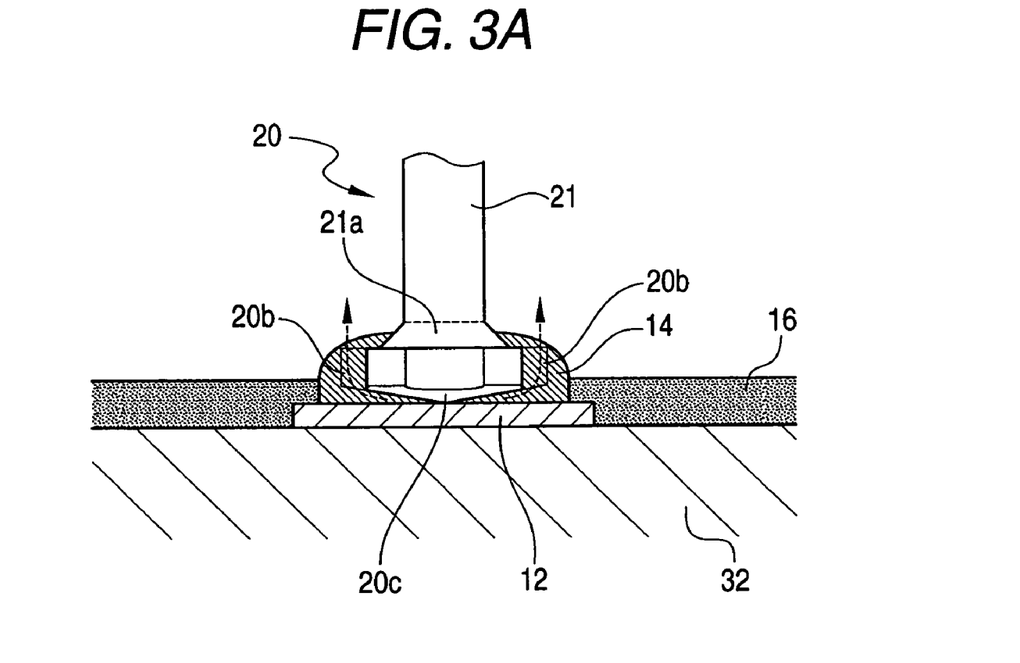
FIGS. 3A and 3B are enlarged sectional views showing a state in which the lead pin is attached to an electrode pad.
Figure 3B:
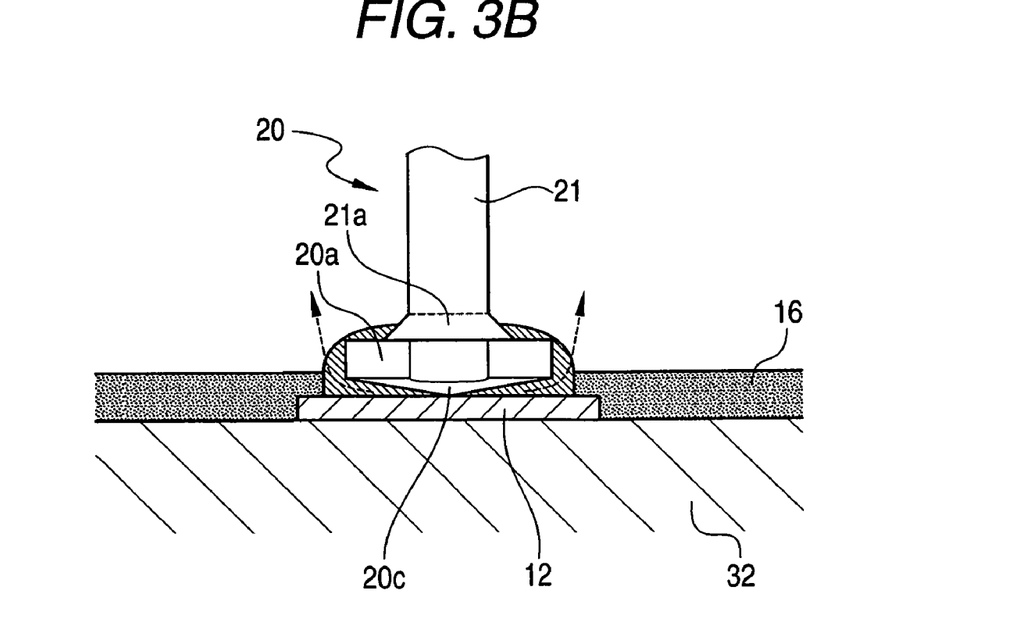

FIGS. 3A and 3B are enlarged views showing a state in which the lead pin 20 is attached to the electrode pad 12. FIG. 3A shows a state in which the head portion 20a of the lead pin 20 is viewed on a section crossing the notch portion 20b, and FIG. 3B shows a state in which the head portion 20a of the lead pin 20 is viewed on a section in a direction of a maximum diameter.

As shown in FIGS. 3A and 3B, the lead pin 20 of this embodiment is attached to the electrode pad 12 by making the conical protrusion 20c formed on the end face of the head portion 20a abut on the electrode pad 12, and attaching the head portion 20a to the electrode pad 12 by the solder 14.

An operation of attaching the lead pins 20 to the electrode pads 12 is performed by a method in which the solder paste is applied to the surfaces of the electrode pads 12, the lead pins 20 are respectively arranged so as to be aligned with the electrode pads 12 by using the support jigs, and the lead pins 20 are attached to the electrode pads 12 by reflow heating.

Since in the lead pin 20 of this embodiment, the end face abutting on the electrode pad 12 is formed as the conical protrusion 20c, when the lead pin 20 is arranged on the electrode pad 12, the end face of the lead pin 20 is separated from the surface of the electrode pad 12. Accordingly, when the solder paste is heated, and gas is generated as a result of volatilizing a flux composition included in the solder paste, the gas can escape from a space between the end face of the lead pin 20 and the electrode pad 12. In FIGS. 3A and 3B, arrows indicate that the flux composition of the solder paste or air mixed in the solder paste is released.

As can be understood by comparing FIGS. 3A and 3B, since in the lead pin 20 of this embodiment, the notch portions 20b are provided in the peripheral edge portion of the head portion 20a, a distance from a center of the head portion 20a to an outer peripheral edge of the head portion 20a is shorter in a part where the notch portion 20b is provided than a distance from the center of the head portion 20a to an outer peripheral edge of the head portion 20a in a part where the notch portion 20b is not provided. Since the notch portions 20b are provided so as to penetrate in the direction of thickness of the head portion 20a, the flux composition included in the solder paste or the air mixed in the solder paste can easily be released externally from the notch portions 20b.

Further, since the end face of the head portion 20a is formed as the conical protrusion 20c, the flux composition volatilized from the solder paste or the air mixed in the solder paste can easily move to an outer part where the separating space is widely formed. By this operation, the flux composition in the solder paste, etc. can be released externally more easily.

Figure 4A:
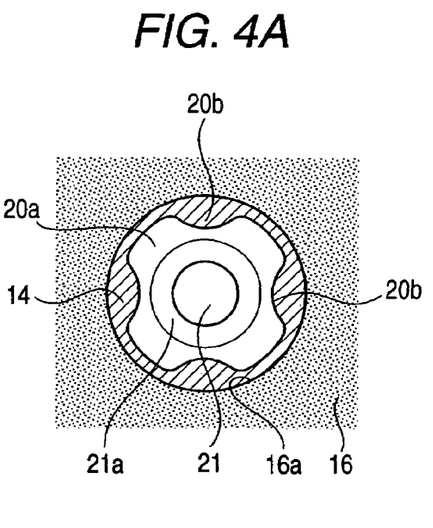
FIGS. 4A and 4B are top views showing a state in which the lead pin is attached to the electrode pad.

FIG. 4A is a view showing a state in which the lead pin 20 is attached to the electrode pad 12, the state being viewed from the upper surface side of the lead pin 20. The solder 14 is filled between an inner edge of an opening portion 16a of the solder resist 16 and the peripheral edge portion of the head portion 20a. A separating space between the peripheral edge portion of the head portion 20a and the inner edge of the opening portion 16a is widened in a part where the notch portion 20b is formed.

When the lead pin having an extremely small diameter is employed as in the lead pin 20 used in this embodiment, attached state of the lead pin is hardly visually recognized. However, since the notch portions 20b are formed in the head portion 20a, filling state of the solder 14 in the notch portions 20b can be visually recognized and the attached state of the lead pin can be easily recognized.

Further, since the notch portions 20b are provided in the head portion 20a, the notch portions 20b are filled with the solder 14, and an amount of the solder 14 for attaching the lead pin 20 to the electrode pad 12 is ensured. Thus, an appropriate bonding strength of the lead pin 20 can be obtained. Further, since the end face of the head portion 20a is formed as the conical protrusion 20c, the solder 14 is filled between the end face of the head portion 20a and the surface of the electrode pad 12 so as to effectively ensure the amount of the solder 14.

Since the notch portions 20b are provided in the head portion 20a, a length of an outer periphery of the head portion 20a is longer than that of a case in which an outline of the head portion 20a is formed in a circular shape, and a contact area of the solder 14 and the head portion 20a is increased. Thus, the bonding strength of the lead pin 20 and the electrode pad 12 can be increased.

Still further, since the notch portions 20b are provided on the outer peripheral surface of the head portion 20a, edge portions of the notch portions 20b become closer to an edge portion of the C chamfered portion 21a provided in the shaft portion 21 in view of a positional relation. As a result, as shown in FIGS. 3A and 3B, the solder 14 filled in the notch portions 20b easily goes up from the notch portions 20b to the C chamfered portion 21a so that the lead pin 20 is attached to the electrode pad 12 in the state that the solder 14 goes up to the outer surface of the C chamfered portion 21a. As described above, the lead pin 20 is attached to the electrode pad 12 by the solder 14 going up to the C chamfered portion 21a. Thus, the bonding strength of the lead pin 20 is more increased.

Specifically, the notch portions 20b may be cut in to the edge portion of the C chamfered portion 21a so that the edge portions of the notch portions 20b is closer to the edge portion of the C chamfered portion 21a in view of the positional relation. Accordingly, the solder 14 goes up from the notch portions 20b to the C chamfered portion 21a more easily.

Now, an explanation will be given to results of comparison and measurement of a void generation rate, the bonding strength of the lead pin and a shift amount of the lead pin, by using the wiring board with lead pins using the lead pin 20 according the embodiment of the invention and a wiring board with lead pins using a related lead pin of what is called the flat pin type as shown in FIGS. 6A-6C.

(Void Generation Rate)

As for the void generation rate, the lead pin according to the embodiment of the invention and the flat pin type lead pin are attached to the wiring board by using the solder paste, and X-ray photographs of the attached portions of the lead pins are taken. Then, states of the void generation are observed and compared. As for the flat pin type lead pin, the outside diameter of the shaft portion is 0.3 mm, and the outside diameter of the head portion 5a is 0.7 mm. Melting temperature of the solder paste used for attaching the lead pins is 245° C.

As a result of observing the voids generated in the head portions of the lead pins by using the X-ray photographs, when the related flat pin was used, a relatively large void was generated in the lower part of the head portion. As compared therewith, when the lead pin according to the embodiment was used, a large void that causes a problem was not found.

Assuming that the void generation rate is a number of the electrode pads for which the voids are generated relative to the total number of the electrode pads formed on the wiring board, when the related flat pin was used, the void generation rate was constantly equal to 1 percent or more. As compared therewith, when the lead pin according to the embodiment was used, as a result of examining several ten thousands of the electrode pads, the voids to be a problem were not found, and the void generation rate could be reduced to 0 percent. This means that the lead pin 20 according to the embodiment has an effective function for suppressing the generation of the voids.

(Shift Amount of Lead Pin)

After the lead pins are attached to the wiring board with the solder, the wiring board is reheated, and an amount of displacement between a position of the lead pin before the wiring board is reheated and a position of the lead pin after the wiring board is reheated is measured.

In an actual experiment, the lead pins are attached to the wiring board at 270° C. by using the solder paste, and the attached positions of the lead pins attached to the wiring board are measured respectively. Then, the wiring board is reheated at 267° C., and the attached positions of the lead pins after the wiring board is reheated are measured. Subsequently, a shift amount of each lead pin between the positions of the lead pin before and after the wiring board is reheated is calculated. The melting temperature of the solder that is used is 245° C., which satisfies a condition that the solder melts when the wiring board is reheated.

Table 1 shows an average value of a shift amount of a lead pin, a maximum shift amount and a standard deviation σ when the flat pin and the lead pin according to the embodiment are used.

TABLE 1

Shift amount before and after reheating (mm)

n = 66

| Lead pin | Flat pin (comparative example) | Embodiment of the invention |
|---|---|---|
| Average value | 0.06 | 0.02 |
| Maximum value | 0.21 | 0.06 |
| Minimum value | 0.00 | 0.00 |
| Standard deviation σ | 0.05 | 0.01 |

As apparent from the measured results of the Table 1, when the lead pin according to the embodiment is employed, it is clear that the shift amount of the lead pin before and after the wiring board is reheated is more suppressed than that when the related flat pin is used. Therefore, it is considered that when the lead pins are attached to the electrode pads, the voids do not remain in the attached portions, and accordingly, the displacements of the lead pins are suppressed when the wiring board is reheated.

(Shift Amount of Lead Pin From Normal Position)

The wiring board with lead pins is reheated under the same conditions as those of the above-described experiment for measuring the shift amount of the lead pin before and after the wiring board is reheated, and how much the lead pins are displaced from their normal positions are measured. The normal position of the lead pin indicates a position set as the design position of the electrode pad based on a position of an outer end face of the wiring board.

Table 2 shows results obtained by measuring a shift amount of the lead pin from the normal position as an average value, a maximum value, a minimum value and a standard deviation σ of the shift amount.

TABLE 2

Shift amount from normal position (mm)

n = 66

| Lead pin | Flat pin (comparative example) | Embodiment of the invention |
|---|---|---|
| Average value | 0.16 | 0.10 |
| Maximum value | 0.27 | 0.19 |
| Minimum value | 0.01 | 0.02 |
| Standard deviation σ | 0.07 | 0.04 |

As apparent from the measured results of the Table 2, when the lead pin according to the embodiment is employed, the shift amount of the lead pin from its normal position is evidently more suppressed than that when the flat pin is used, and unevenness in the shift amount is smaller. That is, when the wiring board using the lead pins according the embodiment is reheated to an extent that the solder melts, the lead pins can be prevented from shifting from their normal positions. Thus, the wiring board with lead pins having high reliability can be provided.

(Bonding Strength of Lead Pin)

The wiring board with lead pins is reheated in the same manner as that of the above-described experiment, and the bonding strength of the lead pin after the wiring board is reheated is measured. Table 3 shows the measured results.

TABLE 3

Bonding strength of lead pin (kgF)

| Lead pin | Flat pin (comparative example) (n = 66) | Embodiment of the invention (n = 107) |
|---|---|---|
| Average value | 3.02 | 3.00 |
| Maximum value | 3.34 | 3.23 |
| Minimum value | 1.57 | 2.37 |
| Standard deviation σ | 0.22 | 0.17 |

According to the measured results of the Table 3, the average value of the bonding strength of the flat pin is almost the same as that of the lead pin according to the embodiment. In the case of using the related flat pin, the bonding strength of an extremely low value exists. However, in the case of using the lead pin according to the embodiment, unevenness in the bonding strength of the lead pin is suppressed. Thus, a stable bonding strength can be obtained as a whole.

As apparent from the above-described measured results of the void generation rate of the solder attached portion, the shift amount of the lead pin, etc., even when the wiring board with lead pins obtained by attaching the lead pins according to the embodiment of the invention to the electrode pads is reheated to such temperature as to melt the solder, the displacement or the inclination of the lead pins can be suppressed. Thus, the wiring board having an extremely high reliability can be provided.

Next, an explanation will be given to results of comparison and measurement of the bonding strength of the lead pin. In this case, the wiring board with lead pins using the lead pin 20, which has the notch portions 20b in the head portion 20a, according the embodiment of the invention, and a wiring board with lead pins using a lead pin of which end face of a head portion is conically-shaped (for example, refer to JP-A-2001-217342, in which a lead pin of which end face of a head portion is entirely in a convex shape), but is not provided with the notch portion are used. As for the comparative lead pin in which the notch portion is not provided in the head portion thereof, the outside diameter of the shaft portion is 0.3 mm, and the outside diameter of the head portion is 0.7 mm.

(Bonding Strength of Lead Pin)

The wiring board with lead pins is reheated in the same manner as that of the above-described experiment, and the bonding strength of the lead pin after the wiring board is reheated is measured. Table 4 shows the measured results.

TABLE 4

| | Bonding strength of lead pin (kgF) | |
| --- | --- | --- |
| | | (n = 110) |
| Lead pin | Lead pin without notch portion (comparative example) | Embodiment of the invention |
| Average value | 2.84 | 3.00 |
| Maximum value | 3.17 | 3.23 |
| Minimum value | 2.25 | 2.37 |
| Standard deviation σ | 0.16 | 0.17 |

According to the measured results of the Table 4, the average value, the maximum value, the minimum value and the standard deviation of the bonding strength of the lead pin according to the embodiment are larger than those of the comparative lead pin in which the notch portion is not provided in the head portion thereof.

Thus, it is understood that by providing the notch portions 20b in the head portion 20a, voids can be prevented from remaining in the attached portions of the lead pins more than that in the case of using the lead pin without the notch portion. These results indicate that it is effective to provide the notch portions 20b in the head portion 20a of the lead pin.

Figure 5A:
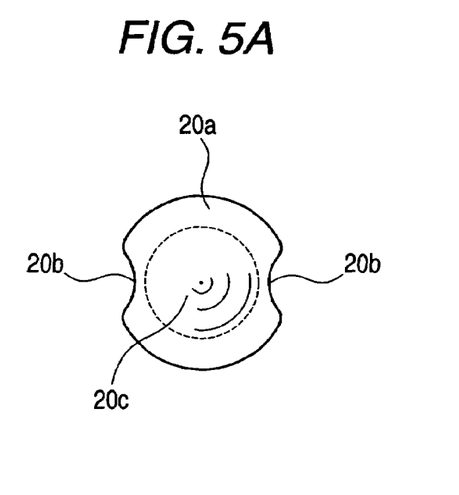
FIGS. 5A and 5B are plan views showing another example of a lead pin.
Figure 5B:
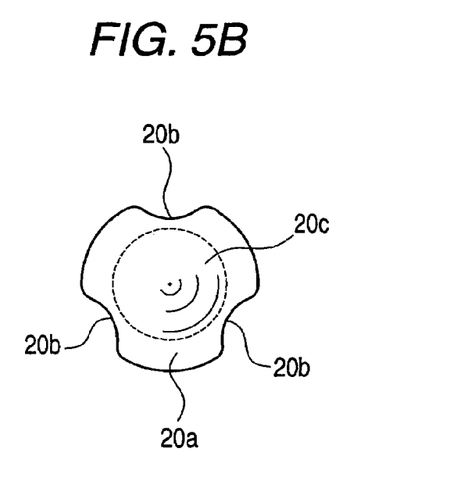

In the above-described embodiment, the lead pin 20 is described that has the four notch portions 20b formed in the head portion 20a. However, the number of the notch portions 20b formed on the head portion 20a and the cut-out shape of the notch portions 20b formed on the head portion 20a are not limited to those of the lead pin 20 of the embodiment, and a suitable number, for instance, a single or a plurality of notch portions may be formed. FIG. 5A shows an example in which two notch portions 20b are formed in the head portion 20a, and FIG. 5B shows an example in which three notch portions 20b are formed in the head portion 20a.

Figure 4B:
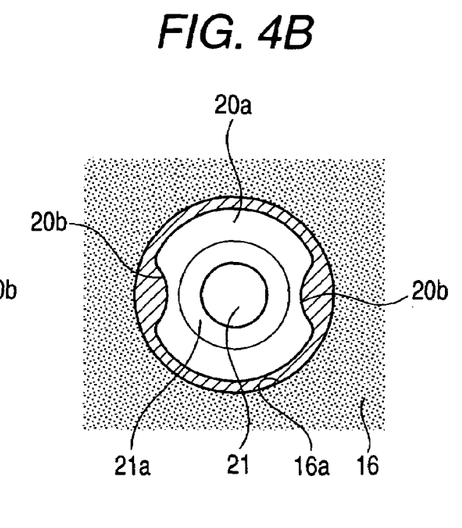

FIG. 4B shows a state in which the lead pin having two notch portions 20b formed on the head portion 20a is attached to the electrode pad 12. Also in a case of this lead pin, since the notch portions 20b are formed in the head portion 20a, the flux composition included in the solder paste or the air mixed in the solder paste can be easily released from the notch portions 20b. Further, since the notch portions 20b are filled with the solder 14, the amount of the solder for attaching the lead pin to the electrode pad can be ensured, and the solder filled in the notch portions 20b easily goes up to the C chamfered portion 21a of the shaft portion 21. Thus, the bonding strength of the lead pin can be increased.

In the above-described embodiment, an example is described that the lead pin 20 is attached to the electrode pad 12 of the wiring board by using the solder paste 14a. However, the present invention is likewise applied to a case where the lead pin 20 is attached to the electrode pad 12 by using an electrically conductive adhesive other than the solder paste 14a.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A wiring board comprising:
at least one electrode pad formed on the wiring board; and
at least one lead pin of which head portion is attached to the electrode pad with a conductive agent,
wherein the head portion of the lead pin has an end face which is formed in a conically protruded shape, the end face facing the electrode pad,
wherein the head portion of the lead pin has multiple notch portions formed in a peripheral edge portion of the head portion,
wherein the multiple notch portions are filled with the conductive agent when the lead pin is attached to the electrode pad, and
wherein the multiple notch portions extend from a top to a bottom of the head portion and are cut out in a direction of a thickness of the head portion which increases a length of the peripheral edge of the head portion thereby increasing a contact area between the conductive agent and the head portion thus increasing the bond strength between the lead pin and the electrode pad.

2. The wiring board according to claim 1, wherein the multiple notch portions comprise four notch portions provided at equal intervals in a circumferential direction of the head portion.

3. The wiring board according to claim 1, wherein
the lead pin includes a shaft portion which is integrally formed with the head portion through a C chamfered portion,
the C chamfered portion is formed in a part of the shaft portion, and
a surface of the C chamfered portion is tapered shaped so that the C chamfered portion is enlarged in diameter on the head portion side.

4. The wiring board according to claim 3, wherein
a distance between an edge portion of the notch portion and an edge portion of the C chamfered portion is smaller than a distance between an outer circumferential surface of the head portion and the edge portion of the C chamfered portion.

5. The wiring board according to claim 2, wherein
the lead pin includes a shaft portion which is integrally formed with the head portion through a C chamfered portion,
the C chamfered portion is formed in a part of the shaft portion, and
a surface of the C chamfered portion is tapered shaped so that the C chamfered portion is enlarged in diameter on the head portion side.

6. The wiring board with lead pins according to claim 5, wherein
distances between each of edge portions of the notch portions and an edge portion of the C chamfered portion are smaller than a distance between an outer circumferential surface of the head portion and the edge portion of the C chamfered portion.

7. The wiring board with lead pins according to claim 1, wherein the conductive agent is solder.

8. A lead pin used for a wiring board, the lead pin comprising:
a head portion of which end face facing an electrode pad of the wiring board is formed in a conically protruded shape; and
a shaft portion which is integrally formed with the head portion,
wherein the head portion has multiple notch portions formed in a peripheral edge portion of the head portion,
wherein the multiple notch portions are filled with a conductive agent when the lead pin is attached to the wiring board, and
wherein the multiple notch portions extend from a top to a bottom of the head portion and are cut out in a direction of a thickness of the head portion which increases a length of the peripheral edge of the head portion thereby increasing a contact area between the conductive agent and the head portion thus increasing the bond strength between the lead pin and the wiring board.

9. The lead pin according to claim 8, wherein said at least one notch portion comprises four notch portions being provided at equal intervals in a circumferential direction of the head portion.

10. The lead pin according to claim 8, wherein
a connection portion of the shaft portion and the head portion is formed as a C chamfered portion of which surface is tapered shaped so that the C chamfered portion is enlarged in diameter on the head portion side, and
the C chamfered portion is formed in a part of the shaft portion.

11. The lead pin according to claim 10, wherein
a distance between an edge portion of the notch portion and an edge portion of the C chamfered portion is smaller than a distance between an outer circumferential surface of the head portion and the edge portion of the C chamfered portion.

12. The lead pin according to claim 9, wherein
a connection portion of the shaft portion and the head portion is formed as a C chamfered portion of which surface is tapered shaped so that the C chamfered portion is enlarged in diameter on the head portion side, and
the C chamfered portion is formed in a part of the shaft portion.

13. The lead pin according to claim 12, wherein
distances between each of edge portions of the notch portion and an edge portion of the C chamfered portion are smaller than a distance between an outer circumferential surface of the head portion and the edge portion of the C chamfered portion.

* * * * *